United States Patent [19]
Hwang

[11] Patent Number: 6,153,502
[45] Date of Patent: Nov. 28, 2000

[54] METHOD OF FABRICATING SEMICONDUCTOR DEVICE HAVING ANALOG PROPERTIES

[75] Inventor: Gyu-Sang Hwang, Suwon, Rep. of Korea

[73] Assignee: Samsung Electronics, Co., Ltd., Suwon, Rep. of Korea

[21] Appl. No.: 09/140,274

[22] Filed: Aug. 26, 1998

[30] Foreign Application Priority Data

Aug. 27, 1997 [KR] Rep. of Korea ................ 97-41428

[51] Int. Cl.[7] ................................ H01L 21/4763
[52] U.S. Cl. .............................. 438/595; 438/234
[58] Field of Search ................................ 438/234, 595

[56] References Cited

U.S. PATENT DOCUMENTS

| | | | |
|---|---|---|---|
| 5,296,400 | 3/1994 | Park et al. | 438/595 |
| 5,472,895 | 12/1995 | Park | 438/595 |
| 5,480,837 | 1/1996 | Liaw et al. | 438/595 |
| 5,766,992 | 6/1998 | Chou et al. | 438/595 |
| 5,780,339 | 7/1998 | Liu et al. | 438/595 |
| 5,924,011 | 7/1999 | Huang | 438/655 |

*Primary Examiner*—Charles Bowers
*Assistant Examiner*—David S Blum
*Attorney, Agent, or Firm*—Marger Johnson & McCollom, P.C.

[57] ABSTRACT

A method is provided for fabricating an analog and a digital semiconductor device close to each other on a surface of a semiconductor substrate. The analog device is formed on an insulating layer, and in a step configuration with respect to the insulating layer on the side of the digital device. Some deposition steps are used for forming both devices. In addition, the method teaches to form a spacer out of insulating material in the concave corner of the step configuration. The spacer prevents unwanted residual matter from remaining in the concave corner after an etching step and insulates the analog device better.

17 Claims, 5 Drawing Sheets

METHOD OF FABRICATING SEMICONDUCTOR DEVICE HAVING ANALOG PROPERTIES

CROSS REFERENCE TO RELATED APPLICATIONS

This application claims priority from Korean Priority Document No. 97-41428, filed on Aug. 27, 1997 with the Korean Industrial Property Office, which document is hereby incorporated by reference.

BACKGROUND OF THE INVENTION

1. Field of the Invention

The present invention relates to a method of fabricating a semiconductor device and, more particularly, to a method of fabricating an analog semiconductor device on a surface of a semiconductor substrate and in a step configuration with respect to it, that prevents unwanted residual matter from remaining in the concave corner of the step configuration after an etching process step.

2. Discussion of the Prior Art

A conventional method of fabricating an analog semiconductor device on a surface of a semiconductor substrate is described with reference to FIGS. 1 and 2A–2C.

Referring to FIG. 1, a semiconductor substrate 100 is provided with a surface. The surface has designated on it an analog portion 3, a digital portion 5, and a margin portion 7 between the analog and the digital portion. An insulating layer 2 is formed on the analog portion and at least a part of the margin portion.

Then a structure having analog properties is formed on the analog portion as follows. A first polysilicon layer 4 having a thickness of 2000 A is formed on layer 2. Then an oxide layer and a nitride layer are deposited sequentially on polysilicon layer 4, having thicknesses of 70 A and 700 A respectively. The oxide layer and the nitride layer thus form an ON (Oxide/Nitride) structure 6. Then ON structure 6 and polysilicon layer 4 are patterned through a photolithographic method into a designated pattern. The pattern from polysilicon layer 4 is a part of the analog semiconductor device, and is also known as first designated pattern. Its lateral side closest to the digital portion is at the boundary of the analog portion and the margin portion.

As seen in FIG. 1, the analog structure is thus in a step configuration 9 with respect to the top surface of the section of the insulating layer that is on the margin portion. The step configuration is formed from the top surface of structure 6, the lateral side of the first designated pattern closest to the digital portion, and the top surface of the section of the insulating layer that is on the margin portion. The step configuration thus defines a convex corner where the top surface meets the lateral side. The step configuration also defines a concave corner in the vicinity where the insulating layer meets the lateral side. The two corners have a height difference that is called a step difference of the step configuration.

A digital device is then formed on the digital portion of the substrate surface. The next process step, shown in FIG. 2A, is to form a gate oxide layer 8 of thickness 120 A by oxidation.

A second polysilicon layer 10 and a WSix layer 12 are then deposited sequentially on the entire resulting structure, each having a thickness of 1500 A. Layers 10 and 12 will be used to form gates on the analog and digital devices. A plasma enhanced ("PE")-oxide layer 14 and a SiON layer 16 are then deposited sequentially on layer 12, having thicknesses of 2000 A and 620 A respectively. Layers 14 and 16 function as an anti-reflective surface.

Then PE-oxide layer 14 is etched into a designated pattern by a photolithographic method. Next WSix layer 12 is patterned, using the PE-oxide pattern as a mask, resulting in the structure shown in FIG. 2B. Then second polysilicon layer 10 is selectively etched using the WSix pattern as a mask. This forms a second designated pattern.

WSix layer 12 and polysilicon layer 10 are etched by the oxide layer hard masking technique using oxide layer 14. This patterns normally the structure in the digital portion of the surface. However, etching is not completed in the margin portion, if the step difference is high. That is because the high step difference has caused the polysilicon and WSix layers to be relatively thick at the concave corner of the step configuration. Accordingly, residual matter from WSix layer 12 remains on layer 10 in stringer form A.

Further, as seen in FIG. 2C, when polysilicon layer 10 is removed, residual matter from it remains in the concave corner of the step configuration in stringer form B. Such residual matters affect the subsequent process steps in the fabrication method. Worse, the residual matter can bridge the analog device with the substrate, which causes leakage. The problem is exacerbated when the digital device is nearby. This causes the overall device to fail in the ESD (Electro-Static Discharge) and package tests that are performed after the fabrication method is completed, which reduces the yield of the product.

In the prior art such residual matters are removed sometimes by additional etching. This generally poses the risk of overetching, which creates the hazard of pitting.

SUMMARY OF THE INVENTION

Accordingly, the present invention is directed to a method of fabricating an analog semiconductor device on a semiconductor substrate that substantially obviates one or more of the problems due to limitations and disadvantages of the prior art.

The present invention provides a method of fabricating such a device that prevents unwanted residual matter from remaining in the concave corner of the step configuration after an etching step. The method teaches to form the analog device in a step configuration with respect to the insulating layer, and to form a spacer in the concave corner of the step configuration. The spacer prevents the second polysilicon layer and the WSix layer from being deposited thickly in the concave corner, even if there is a high step difference. Since generally no residual matter remains, additional etching is not necessary and its hazards are avoided.

Even if residual matter remained, it would be formed farther away from the analog device which reduces leakage. The spacer is preferably made from insulating material, which further blocks the leakage pathway. Additionally, the spacer has a rounded top surface which reduces the sharpness of the convex corner of the step configuration. This makes easier the subsequent conformal deposit of the polysilicon layer.

The method of the present invention includes the process steps of preparing a semiconductor substrate with a surface, and designating on the surface an analog portion for forming an analog device thereon, a digital portion for forming a digital device thereon, and a margin portion between the analog and digital portions. Then an insulating layer is formed on the analog and at least a part of the margin portions of the surface. Then a first conductive layer is formed on the section of the insulating layer that is on the analog portion. The first conductive layer is then formed into a first designated pattern. The first pattern is in a step configuration with respect to a section of the insulating layer that is on the margin portion of the substrate surface. The step configuration defines a concave corner. Then a spacer is formed in the concave corner from an insulating material such as an oxide. Then a second conductive layer is formed on the resulting structure, and formed into a second designated pattern.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF PREFERRED EMBODIMENT

As mentioned above, the present invention provides a method for forming an analog and a digital semiconductor device close to each other on a surface of a substrate. The analog device is formed on an insulating layer, and in a step configuration with respect to the insulating layer on the side of the digital device. The method of the invention teaches to form a spacer in the concave corner of the step configuration.

The method of the invention starts after the process step seen in FIG. 1, and is described with reference to FIGS. 3A–3E as follows.

Figure 1:
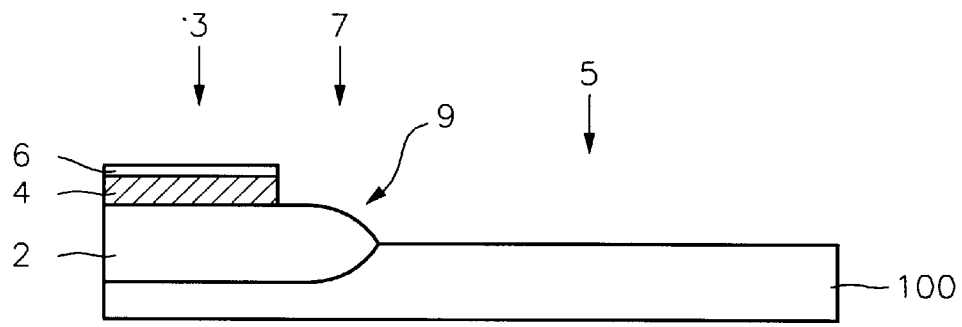
FIG. 1 is a diagram of a process step of a method in the prior art for fabricating an analog semiconductor device on a surface of a semiconductor substrate.
Figure 3A:
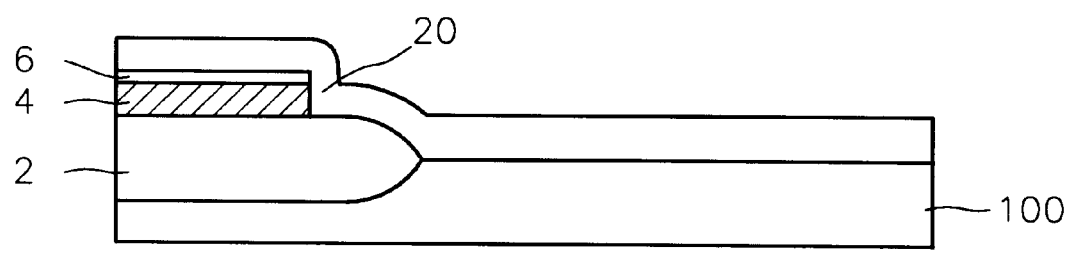
FIGS. 3A–3E are diagrams illustrating successive process steps performed after the process step of FIG. 1 according to the method of the present invention.

As seen in FIG. 3A, an insulating layer 20 is formed on the whole surface of the device seen in FIG. 1. Insulating layer 20 has thickness of 1000 A, and can be a PE-oxide layer.

Figure 3B:
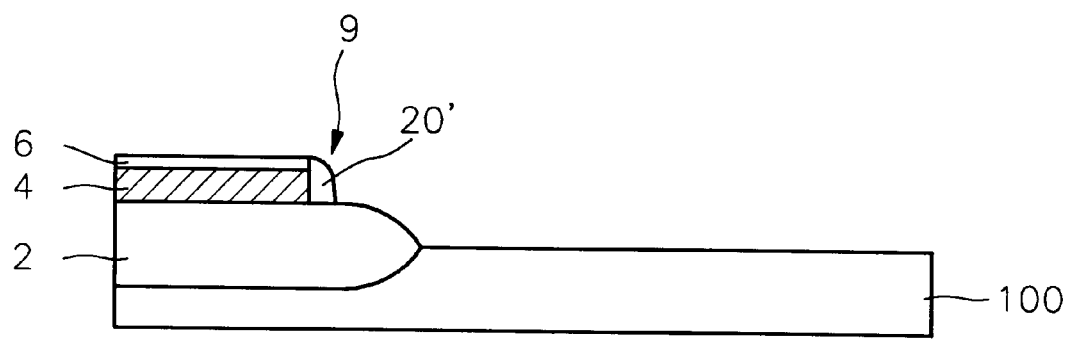

Referring to FIG. 3B, insulating layer 20 is etched (or plasma etched) to form a spacer 20' in the concave corner of step configuration 9. Spacer 20' thus contacts the lateral side of the first polysilicon pattern, and the top surface of the section of insulating layer 2 that is on the margin portion of the substrate.

Figure 3C:
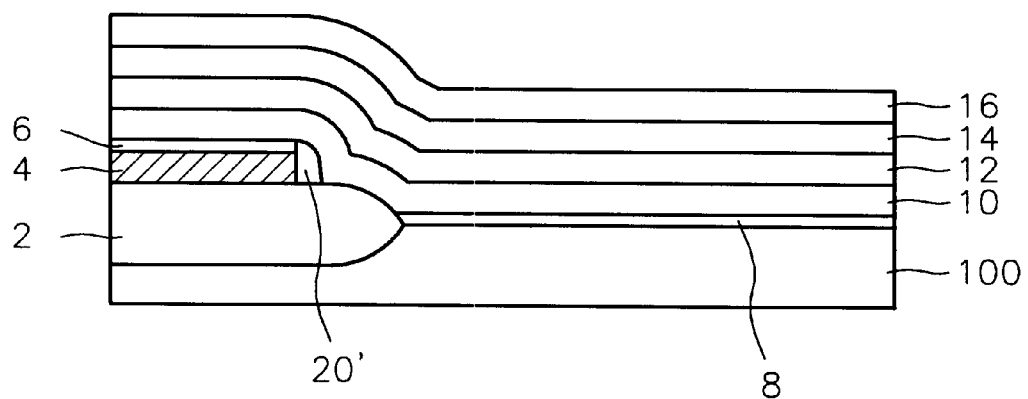

Next, as shown in FIG. 3C, an oxidation is performed to deposit a gate oxide layer 8 of thickness 120 A on the digital portion of the surface of the substrate. It will be obvious to a person having ordinary skill in the art that layer 8 could instead be formed before spacer 20' is formed.

Then, as shown in FIG. 3C, layers 10, 12, 14 and 16 are formed as was described above in reference with FIG. 2A.

Figure 2A:
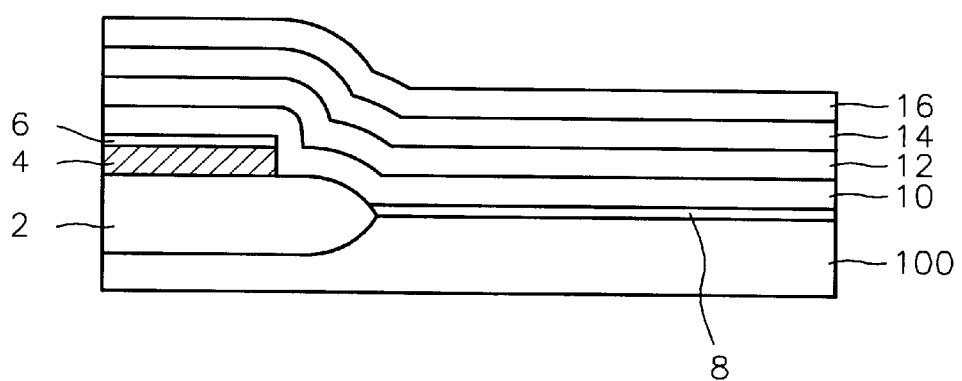
FIGS. 2A–2C are diagrams illustrating successive process steps performed after the process step of FIG. 1 according to a method in the prior art.
Figure 2B:
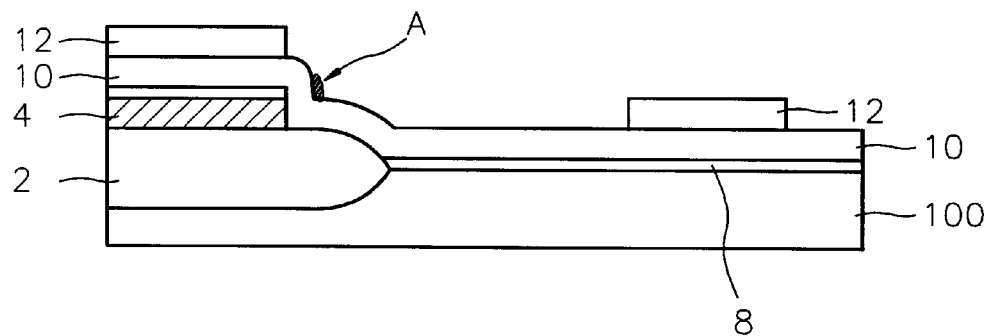
Figure 2C:
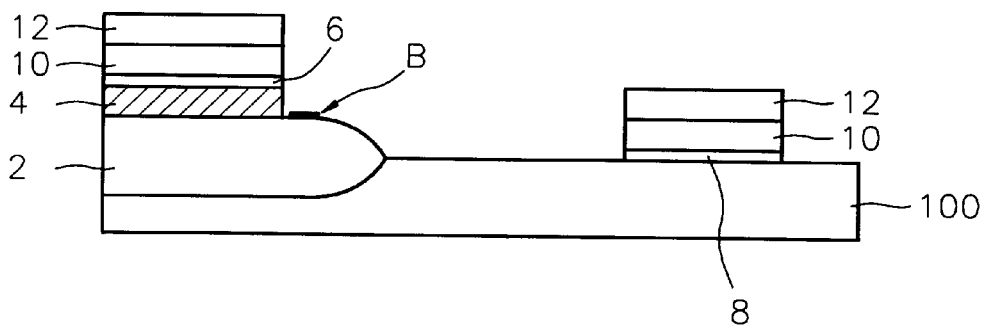

However, compared to what is shown in FIG. 2A, layers 10 and 12 of FIG. 3C are formed less thick at the concave corner, because spacer 20' reduces a depth of the concave corner considered diagonally.

Figure 3D:
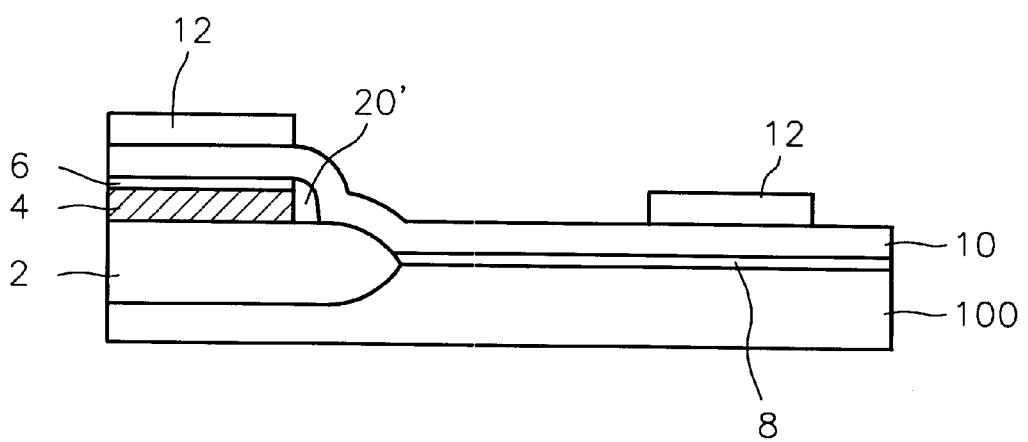

Then, as shown in FIG. 3D, WSix layer 12 is selectively etched to form a designated pattern by an oxide layer hard masking technique using the oxide layer (which is not shown in FIG. 3D because it is removed afterwards). Since layer 12 is more uniformly thick at the concave corner, no residual WSix stringer remains after the etching step of the two portions.

Figure 3E:
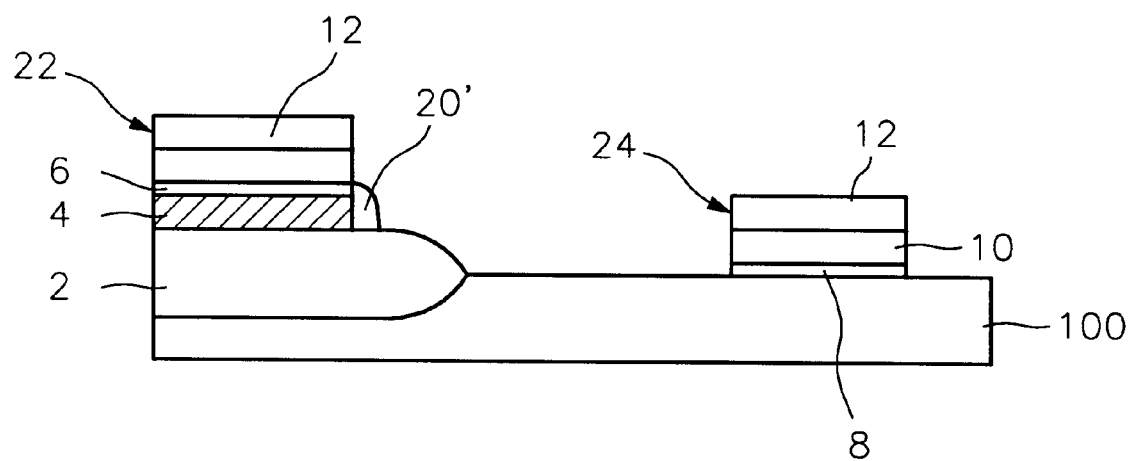

As shown in FIG. 3E, using the pattern from WSix layer 12 as a mask, second polysilicon layer 10 is selectively etched to form a designated polysilicon pattern 10. For the same reason as described above, there remains no residual polysilicon stringer in the concave corner. Thus an analog device 22 and a digital device 24 are formed. It will be appreciated that some of the deposition steps are used in the formation of both devices.

The above example where the WSix layer and the polysilicon layer are etched by the oxide layer hard masking technique is for purposes of illustration only and not of limitation. The use of an equivalent technique such as using a photoresist mask can result in the same effect.

It will be apparent to those skilled in the art that various modifications and variations can be made in the method of fabricating a semiconductor device having analog properties according to the present invention without departing from the spirit or scope of the invention. Thus, it is intended that the present invention cover the modifications and variations of this invention provided they come within the scope of the appended claims and their equivalents.

What is claimed is:

1. A method of fabricating an analog semiconductor device on an insulating layer formed on a semiconductor substrate and a digital semiconductor device on a surface of the substrate adjacent the semiconductor layer, the analog device being in a step configuration with respect to a surface of the insulating layer, the step configuration defining a concave corner in the vicinity where the insulating layer meets a lateral side of the analog device closest to the substrate surface, the method comprising the process step of:

forming a spacer in the concave corner of the step configuration.

2. The method of claim 1, wherein the spacer is formed of insulating material.

3. The method of claim 1, wherein the spacer is formed by the process steps of:

depositing conformally a dielectric oxide layer on the analog device, the insulating layer and the substrate surface adjacent the insulating layer; and etching anisotropically the dielectric oxide layer to expose the two analog device and the substrate surface while leaving the spacer in the concave corner.

4. A method of fabricating capacitor on a surface of a semiconductor substrate, the surface having designated thereon an analog portion, a digital portion, and a margin portion between the analog and digital portions, the method comprising the process steps of:

forming an insulating layer on the analog portion and at least a part of the margin portion of the surface;

forming a first conductive layer on the section of the insulating layer that is on the analog portion;

forming a first designated pattern from the first conductive layer, the first pattern being in a step configuration with respect to a section of the insulating layer that is on the margin portion, the step configuration defining a concave corner which surrounds the analog portion;

forming a spacer in the concave corner, the spacer surrounding the analog portion;

forming a second conductive layer on the resulting structure; and forming a second designated pattern from the second conductive layer.

5. The method as defined in claim 4, wherein on the insulating layer there is formed an analog device and on the digital portion of the surface there is formed a digital device.

6. The method as defined in claim 4, wherein the first conductive layer is formed of polysilicon.

7. The method as defined in claim 4, wherein the spacer is formed of an insulating material.

8. The method as defined in claim 7, wherein the insulating material is an oxide.

9. The method as defined in claim 4, wherein the second conductive layer is formed of polysilicon and WSix.

10. The method as defined in claim 5, wherein the second conductive layer is formed of polysilicon and WSix.

11. A method of fabricating an analog semiconductor device on a surface of a semiconductor substrate, the surface having designated thereon an analog portion, a digital portion, and a margin portion between the analog and digital portions, the method comprising:

forming an insulating layer on the analog portion and at least a part of the margin portion of the surface;

forming a first conductive layer on the section of the insulating layer that is on the analog portion;

forming a first designated pattern from the first conductive layer, the first pattern being in a step configuration with respect to a section of the insulating layer that is on the margin portion, the step configuration defining a concave corner; forming a spacer in the concave corner;

forming a second conductive layer on the resulting structure;

forming a second designated pattern from the second conductive layer; and then forming a digital device on the digital portion.

12. The method of claim 11, wherein the first conductive layer is formed of polysilicon.

13. The method of claim 11, wherein the spacer is formed of an insulating material.

14. The method of claim 13, wherein the insulating material is an oxide.

15. The method of claim 11, wherein the second conductive layer is formed of polysilicon and WSix.

16. The method of claim 11, wherein the second conductive layer is formed of polysilicon and WSix.

17. The method of claim 11, further comprising forming a capacitor on the analog portion.

* * * * *